United States Patent
Li et al.

(10) Patent No.: US 11,579,030 B2
(45) Date of Patent: Feb. 14, 2023

(54) BASELINE ESTIMATION FOR SENSOR SYSTEM

(71) Applicant: Cirrus Logic International Semiconductor Ltd., Edinburgh (GB)

(72) Inventors: Junsong Li, Austin, TX (US); Rahul Gawde, Lakeway, TX (US); Tejasvi Das, Austin, TX (US); Siddharth Maru, Austin, TX (US); Eric B. Smith, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 214 days.

(21) Appl. No.: 17/080,455

(22) Filed: Oct. 26, 2020

(65) Prior Publication Data

US 2021/0396610 A1 Dec. 23, 2021

Related U.S. Application Data

(60) Provisional application No. 63/040,733, filed on Jun. 18, 2020.

(51) Int. Cl.
*G01L 1/00* (2006.01)
*G01L 1/26* (2006.01)

(52) U.S. Cl.
CPC ..................... *G01L 1/26* (2013.01)

(58) Field of Classification Search
CPC .......................................................... G01L 1/26
See application file for complete search history.

(56) References Cited

U.S. PATENT DOCUMENTS

| | | | |
|---|---|---|---|
| 4,268,822 A | 5/1981 | Olsen | |
| 4,888,554 A | 12/1989 | Hyde et al. | |
| 5,286,941 A | 2/1994 | Bel | |
| 5,361,184 A * | 11/1994 | El-Sharkawi | H01H 9/56 |
| | | | 361/93.6 |
| 5,567,920 A | 10/1996 | Watanabe et al. | |
| 5,661,269 A | 8/1997 | Fukuzaki et al. | |
| 5,898,136 A | 4/1999 | Katsurahira | |
| 6,231,520 B1 | 5/2001 | Maezawa | |
| 6,380,923 B1 | 4/2002 | Fukumoto et al. | |
| 6,473,708 B1 * | 10/2002 | Watkins | G01K 15/00 |
| | | | 374/161 |
| 7,173,410 B1 | 2/2007 | Pond | |

(Continued)

FOREIGN PATENT DOCUMENTS

| CN | 10542884 A | 3/2016 |
|---|---|---|
| CN | 106471708 A | 3/2017 |

(Continued)

OTHER PUBLICATIONS

Combined Search and Examination Report under Sections 17 and 18(3), UKIPO, Application No. GB2111666.0, dated Feb. 11, 2022.

(Continued)

*Primary Examiner* — Max H Noori
(74) *Attorney, Agent, or Firm* — Jackson Walker L.L.P.

(57) ABSTRACT

A control method for a user interface system may include receiving an input signal, receiving a temperature signal indicative of a temperature, generating a baseline signal based on at least one among the input signal and the temperature signal, calculating an error signal based on a difference of the input signal and the baseline signal, and modifying the baseline signal based on the error signal.

26 Claims, 8 Drawing Sheets

(56) References Cited

U.S. PATENT DOCUMENTS

| | | |
|---|---|---|
| 8,144,126 B2 | 3/2012 | Wright |
| 8,384,378 B2 | 2/2013 | Feldkamp et al. |
| 8,421,446 B2 | 4/2013 | Straubinger et al. |
| 8,674,950 B2 | 3/2014 | Olson |
| 8,970,230 B2 | 3/2015 | Narayanasamy et al. |
| 9,070,856 B1 | 6/2015 | Rose et al. |
| 9,164,605 B1 | 10/2015 | Pirogov et al. |
| 9,707,502 B1 | 7/2017 | Bonifas et al. |
| 10,168,855 B2 | 1/2019 | Baughman et al. |
| 10,372,328 B2 | 8/2019 | Zhai |
| 10,571,307 B2 | 2/2020 | Acker |
| 10,599,247 B2 * | 3/2020 | Winokur ............... G06F 3/0447 |
| 10,624,691 B2 | 4/2020 | Wiender et al. |
| 10,642,435 B2 | 5/2020 | Maru et al. |
| 10,725,549 B2 | 7/2020 | Marijanovic et al. |
| 10,726,715 B2 | 7/2020 | Hwang et al. |
| 10,908,200 B2 | 2/2021 | You et al. |
| 10,921,159 B1 | 2/2021 | Das et al. |
| 10,935,620 B2 | 3/2021 | Das et al. |
| 10,942,610 B2 | 3/2021 | Maru et al. |
| 10,948,313 B2 | 3/2021 | Kost et al. |
| 11,079,874 B2 | 8/2021 | Lapointe et al. |
| 11,204,670 B2 | 12/2021 | Maru et al. |
| 11,294,503 B2 | 4/2022 | Westerman |
| 2001/0045941 A1 | 11/2001 | Rosenberg et al. |
| 2003/0038624 A1 | 2/2003 | Hilliard et al. |
| 2005/0192727 A1 | 9/2005 | Shostak et al. |
| 2005/0258826 A1 | 11/2005 | Kano et al. |
| 2005/0283330 A1 | 12/2005 | Laraia et al. |
| 2006/0025897 A1 | 2/2006 | Shostak et al. |
| 2006/0293864 A1 | 12/2006 | Soss |
| 2007/0047634 A1 | 3/2007 | Kang et al. |
| 2007/0198926 A1 | 8/2007 | Joguet et al. |
| 2007/0268265 A1 | 11/2007 | XiaoPing |
| 2007/0296593 A1 | 12/2007 | Hall et al. |
| 2007/0296709 A1 | 12/2007 | GuangHai |
| 2008/0007534 A1 | 1/2008 | Peng et al. |
| 2008/0024456 A1 | 1/2008 | Peng et al. |
| 2008/0088594 A1 | 4/2008 | Liu et al. |
| 2008/0088595 A1 | 4/2008 | Liu et al. |
| 2008/0142352 A1 | 6/2008 | Wright |
| 2008/0143681 A1 | 6/2008 | XiaoPing |
| 2008/0150905 A1 | 6/2008 | Grivna et al. |
| 2008/0158185 A1 | 7/2008 | Westerman |
| 2008/0312857 A1 | 12/2008 | Sequine |
| 2009/0008161 A1 | 1/2009 | Jones et al. |
| 2009/0009195 A1 | 1/2009 | Seguine |
| 2009/0058430 A1 | 3/2009 | Zhu |
| 2009/0140728 A1 | 6/2009 | Rollins et al. |
| 2009/0278685 A1 | 11/2009 | Potyrailo et al. |
| 2009/0302868 A1 | 12/2009 | Feucht et al. |
| 2009/0308155 A1 | 12/2009 | Zhang |
| 2010/0019777 A1 | 1/2010 | Balslink |
| 2010/0045360 A1 | 2/2010 | Howard et al. |
| 2010/0153845 A1 | 6/2010 | Gregorio et al. |
| 2010/0211902 A1 | 8/2010 | Unsworth et al. |
| 2010/0231239 A1 | 9/2010 | Tateishi et al. |
| 2010/0238121 A1 | 9/2010 | Ely |
| 2010/0328249 A1 | 12/2010 | Ningrat et al. |
| 2011/0005090 A1 | 1/2011 | Lee et al. |
| 2011/0214481 A1 | 9/2011 | Kachanov et al. |
| 2011/0216311 A1 | 9/2011 | Kachanov et al. |
| 2011/0267302 A1 | 11/2011 | Fasshauer |
| 2011/0285667 A1 | 11/2011 | Poupyrev et al. |
| 2011/0291821 A1 | 12/2011 | Chung |
| 2011/0301876 A1 | 12/2011 | Yamashita |
| 2013/0018489 A1 | 1/2013 | Grunthaner et al. |
| 2013/0076374 A1 | 3/2013 | Huang |
| 2013/0106756 A1 | 5/2013 | Kono et al. |
| 2013/0106769 A1 | 5/2013 | Bakken et al. |
| 2013/0269446 A1 | 10/2013 | Fukushima et al. |
| 2014/0002113 A1 | 1/2014 | Schediwy et al. |
| 2014/0028327 A1 | 1/2014 | Potyrailo et al. |
| 2014/0137585 A1 * | 5/2014 | Lu ..................... F25B 49/02 62/126 |
| 2014/0225599 A1 | 8/2014 | Hess |
| 2014/0267065 A1 | 9/2014 | Levesque |
| 2015/0022174 A1 | 1/2015 | Nikitin |
| 2015/0027139 A1 * | 1/2015 | Lin ..................... F25B 49/02 62/56 |
| 2015/0077094 A1 | 3/2015 | Baldwin et al. |
| 2015/0084874 A1 | 3/2015 | Cheng et al. |
| 2015/0293695 A1 | 10/2015 | Schonleben et al. |
| 2015/0329199 A1 | 11/2015 | Golborne et al. |
| 2016/0018940 A1 | 1/2016 | Lo et al. |
| 2016/0048256 A1 | 2/2016 | Day |
| 2016/0117084 A1 | 4/2016 | Ording |
| 2016/0162031 A1 | 6/2016 | Westerman et al. |
| 2016/0169717 A1 | 6/2016 | Zhitomirsky |
| 2016/0179243 A1 | 6/2016 | Schwartz |
| 2016/0231874 A1 | 8/2016 | Baughman et al. |
| 2016/0241227 A1 * | 8/2016 | Hirata ................ H01L 29/1608 |
| 2016/0252403 A1 | 9/2016 | Murakami |
| 2016/0305997 A1 | 10/2016 | Wiesbauer et al. |
| 2016/0357296 A1 | 12/2016 | Picciotto et al. |
| 2017/0023429 A1 | 1/2017 | Straeussnigg et al. |
| 2017/0077735 A1 | 3/2017 | Leabman |
| 2017/0093222 A1 | 3/2017 | Joye et al. |
| 2017/0097437 A1 | 4/2017 | Widmer et al. |
| 2017/0140644 A1 | 5/2017 | Hwang et al. |
| 2017/0147068 A1 | 5/2017 | Yamazaki et al. |
| 2017/0168578 A1 | 6/2017 | Tsukamoto et al. |
| 2017/0184416 A1 | 6/2017 | Kohlenberg et al. |
| 2017/0185173 A1 | 6/2017 | Ito et al. |
| 2017/0187541 A1 | 6/2017 | Sundaresan et al. |
| 2017/0237293 A1 | 8/2017 | Faraone et al. |
| 2017/0282715 A1 | 10/2017 | Fung et al. |
| 2017/0322643 A1 | 11/2017 | Eguchi |
| 2017/0328740 A1 | 11/2017 | Widmer et al. |
| 2017/0371380 A1 | 12/2017 | Oberhauser et al. |
| 2017/0371381 A1 | 12/2017 | Liu |
| 2017/0371473 A1 | 12/2017 | David et al. |
| 2018/0019722 A1 | 1/2018 | Birkbeck |
| 2018/0055448 A1 | 3/2018 | Karakaya et al. |
| 2018/0059793 A1 | 3/2018 | Hajati |
| 2018/0067601 A1 | 3/2018 | Winokur et al. |
| 2018/0088064 A1 | 3/2018 | Potyrailo et al. |
| 2018/0088702 A1 | 3/2018 | Schutzberg et al. |
| 2018/0135409 A1 | 5/2018 | Wilson et al. |
| 2018/0182212 A1 | 6/2018 | Li et al. |
| 2018/0183372 A1 | 6/2018 | Li et al. |
| 2018/0195881 A1 | 7/2018 | Acker |
| 2018/0221796 A1 | 8/2018 | Bonifas et al. |
| 2018/0229161 A1 | 8/2018 | Maki et al. |
| 2018/0231485 A1 | 8/2018 | Potyrailo et al. |
| 2018/0260049 A1 | 9/2018 | O'Lionaird et al. |
| 2018/0260050 A1 | 9/2018 | Unseld et al. |
| 2018/0321748 A1 | 11/2018 | Rao et al. |
| 2019/0179146 A1 | 6/2019 | De Nardi |
| 2019/0197218 A1 | 6/2019 | Schwartz |
| 2019/0204929 A1 | 7/2019 | Attari et al. |
| 2019/0235629 A1 | 8/2019 | Hu et al. |
| 2019/0286263 A1 | 9/2019 | Bagheri et al. |
| 2019/0302161 A1 | 10/2019 | You et al. |
| 2019/0302193 A1 | 10/2019 | Maru et al. |
| 2019/0302890 A1 | 10/2019 | Marijanovic et al. |
| 2019/0302922 A1 | 10/2019 | Das et al. |
| 2019/0302923 A1 | 10/2019 | Maru et al. |
| 2019/0326906 A1 | 10/2019 | Camacho Cardenas et al. |
| 2019/0339313 A1 | 11/2019 | Vandermeijden |
| 2019/0377468 A1 | 12/2019 | Micci et al. |
| 2020/0006495 A1 | 1/2020 | Siemieniec et al. |
| 2020/0064160 A1 | 2/2020 | Maru et al. |
| 2020/0133455 A1 | 4/2020 | Sepehr et al. |
| 2020/0177290 A1 | 6/2020 | Reimer et al. |
| 2020/0191761 A1 | 6/2020 | Potyrailo et al. |
| 2020/0271477 A1 | 8/2020 | Kost et al. |
| 2020/0271706 A1 | 8/2020 | Wardlaw et al. |
| 2020/0271745 A1 | 8/2020 | Das et al. |
| 2020/0272301 A1 | 8/2020 | Duewer et al. |
| 2020/0319237 A1 | 10/2020 | Maru et al. |
| 2020/0320966 A1 | 10/2020 | Clark et al. |
| 2020/0373923 A1 | 11/2020 | Walsh et al. |
| 2020/0382113 A1 | 12/2020 | Beardsworth et al. |

(56) References Cited

U.S. PATENT DOCUMENTS

| | | | |
|---|---|---|---|
| 2020/0386804 A1 | 12/2020 | Das et al. | |
| 2021/0064137 A1 | 3/2021 | Wopat et al. | |
| 2021/0140797 A1 | 5/2021 | Kost et al. | |
| 2021/0149538 A1 | 5/2021 | LaPointe et al. | |
| 2021/0152174 A1 | 5/2021 | Yancey et al. | |
| 2021/0361940 A1 | 11/2021 | Yeh et al. | |
| 2021/0396610 A1 | 12/2021 | Li et al. | |
| 2021/0404901 A1 | 12/2021 | Kost et al. | |
| 2021/0405764 A1 | 12/2021 | Hellman et al. | |
| 2022/0075500 A1 | 3/2022 | Chang et al. | |
| 2022/0268233 A1* | 8/2022 | Kennedy | G07C 5/0808 |
| 2022/0307867 A1 | 9/2022 | Das et al. | |
| 2022/0308000 A1 | 9/2022 | Das et al. | |

FOREIGN PATENT DOCUMENTS

| | | | |
|---|---|---|---|
| CN | 107076623 A | 8/2017 | |
| CN | 209069345 U | 7/2019 | |
| DE | 4004450 A1 | 8/1991 | |
| DE | 602004005672 T2 | 12/2007 | |
| DE | 102015215330 A1 | 2/2017 | |
| DE | 102015215331 A1 | 2/2017 | |
| EP | 1697710 B1 | 4/2007 | |
| EP | 2682843 A1 | 1/2014 | |
| GB | 2394295 A | 4/2004 | |
| GB | 2573644 A | 11/2019 | |
| GB | 2582065 A | 9/2020 | |
| GB | 2582864 A | 10/2020 | |
| GB | 2586722 B | 2/2022 | |
| JP | 2006246289 A | 9/2006 | |
| KR | 20130052059 A | 5/2013 | |
| WO | 00/33244 A2 | 6/2000 | |
| WO | 20061354832 A2 | 12/2006 | |
| WO | 2007068283 A1 | 6/2007 | |
| WO | 2016032704 A1 | 3/2016 | |
| WO | 2021101722 A1 | 5/2021 | |
| WO | 2021101723 A1 | 5/2021 | |

OTHER PUBLICATIONS

Examination Report under Section 18(3), UKIPO, Application No. GB2101804.9, dated Feb. 25, 2022.

International Search Report and Written Opinion of the International Searching Authority, International Application No. PCT/US2022/012721, dated Apr. 26, 2022.

Second Office Action, China National Intellectual Property Administration, Application No. 201980022693 5, dated Apr. 13, 2022.

International Search Report and Written Opinion of the International Searching Authority, International Application No. PCT/US2020/059113, dated Feb. 23, 2021.

International Search Report and Written Opinion of the International Searching Authority, International Application No. PCT/US2020/059101, dated Mar. 9, 2021.

First Office Action, China National Intellectual Property Administration, Application No. 201980022689.9, dated Jun. 2, 2021.

First Office Action, China National Intellectual Property Administration, Application No. 201980022693.5, dated Jul. 8, 2021.

International Search Report and Written Opinion of the International Searching Authority, International Application No. PCT/US2021/035695, dated Sep. 9, 20201.

Second Office Action, China National Intellectual Property Administration, Application No. 201980022689.9, dated Oct. 27, 2021.

Second Office Action, China National Intellectual Property Administration, Application No. 201980022693.5, dated Dec. 14, 2021.

International Search Report and Written Opinion of the International Searching Authority, International Application No. PCT/US2019/045554, datd Oct. 17, 2019.

Combined Search and Examination Report, UKIPO, Application No. GB1904250.6, dated Sep. 10, 2019.

International Search Report and Written Opinion of the International Searching Authority, International Application No. PCT/US2019/022518, dated May 24, 2019.

International Search Report and Written Opinion of the International Searching Authority, International Application No. PCT/US2019/022578, dated May 27, 2019.

International Search Report and Written Opinion of the International Searching Authority, International Application No. PCT/US2019/021838, dated May 27, 2019.

Combined Search and Examination Report under Sections 17 and 18(3), UKIPO, Application No. GB2001341.3, dated Jun. 29, 2020.

International Search Report and Written Opinion of the International Searching Authority, International Application No. PCT/US2022/018886, dated Jun. 10, 2022.

Combined Search and Examination Report under Sections 17 and 18(3), UKIPO, Application No. GB2201194.4, dated Jul. 1, 2022.

International Search Report and Written Opinion of the International Searching Authority, International Application No. PCT/US2022/018475, dated Aug. 2, 2022.

First Office Action, China National Intellectual Property Administration, Application No. 202010105829.3, dated Apr. 12, 2022, received by counsel Jul. 28, 2022.

Examination Report under Section 18(3), UKIPO, Application No. GB2015439.9, dated May 10, 2022.

Notice of Preliminary Rejection, Korean Intellectual Property Office, Application No. 10-2020-7029597, dated Jul. 29, 2022.

* cited by examiner

BASELINE ESTIMATION FOR SENSOR SYSTEM

RELATED APPLICATIONS

The present disclosure claims priority to U.S. Provisional Patent Application Ser. No. 63/040,733, filed Jun. 18, 2020, which is incorporated by reference herein in its entirety. The present disclosure also relates to U.S. patent application Ser. No. 16/267,079, filed Feb. 4, 2019, U.S. patent application Ser. No. 16/422,543, filed May 24, 2019, U.S. patent application Ser. No. 16/866,175, filed May 4, 2020, all of which are incorporated by reference herein in their entireties.

FIELD OF DISCLOSURE

The present disclosure relates in general to electronic devices with user interfaces, (e.g., mobile devices, game controllers, instrument panels, etc.), and more particularly, an integrated haptic system for use in a system for mechanical button replacement in a mobile device, for use in haptic feedback for capacitive sensors, and/or other suitable applications.

BACKGROUND

Many traditional mobile devices (e.g., mobile phones, personal digital assistants, video game controllers, etc.) include mechanical buttons to allow for interaction between a user of a mobile device and the mobile device itself. However, such mechanical buttons are susceptible to aging, wear, and tear that may reduce the useful life of a mobile device and/or may require significant repair if malfunction occurs. Also, the presence of mechanical buttons may render it difficult to manufacture mobile devices to be waterproof. Accordingly, mobile device manufacturers are increasingly looking to equip mobile devices with virtual buttons that act as a human-machine interface allowing for interaction between a user of a mobile device and the mobile device itself. Similarly, mobile device manufacturers are increasingly looking to equip mobile devices with other virtual interface areas (e.g., a virtual slider, interface areas of a body of the mobile device other than a touch screen, etc.). Ideally, for best user experience, such virtual interface areas should look and feel to a user as if a mechanical button or other mechanical interface were present instead of a virtual button or virtual interface area.

Presently, linear resonant actuators (LRAs) and other vibrational actuators (e.g., rotational actuators, vibrating motors, etc.) are increasingly being used in mobile devices to generate vibrational feedback in response to user interaction with human-machine interfaces of such devices. Typically, a sensor (traditionally a force or pressure sensor) detects user interaction with the device (e.g., a finger press on a virtual button of the device) and in response thereto, the linear resonant actuator may vibrate to provide feedback to the user. For example, a linear resonant actuator may vibrate in response to user interaction with the human-machine interface to mimic to the user the feel of a mechanical button click.

However, there is a need in the industry for sensors to detect user interaction with a human-machine interface, wherein such sensors provide acceptable levels of sensor sensitivity, power consumption, and size. For example, one challenge in the implementation of a virtual button is the accurate discrimination between actual user interaction with the virtual button and anomalous sensor inputs such as those caused by force sensor drift (e.g., due to aging and temperature) and/or device bending.

SUMMARY

In accordance with the teachings of the present disclosure, the disadvantages and problems associated with use of a virtual button in a mobile device may be reduced or eliminated.

In accordance with embodiments of the present disclosure, a control method for a user interface system may include receiving an input signal, receiving a temperature signal indicative of a temperature, generating a baseline signal based on at least one among the input signal and the temperature signal, calculating an error signal based on a difference of the input signal and the baseline signal, and modifying the baseline signal based on the error signal.

In accordance with these and other embodiments of the present disclosure, a system may include a first input for receiving an input signal, a second input for receiving a temperature signal indicative of a temperature, an output for generating a baseline signal based on the input signal, and a baseline calculation engine configured to generate a baseline signal based on at least one among the input signal and the temperature signal, calculate an error signal based on a difference of the input signal and the baseline signal, and modify the baseline signal based on the error signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
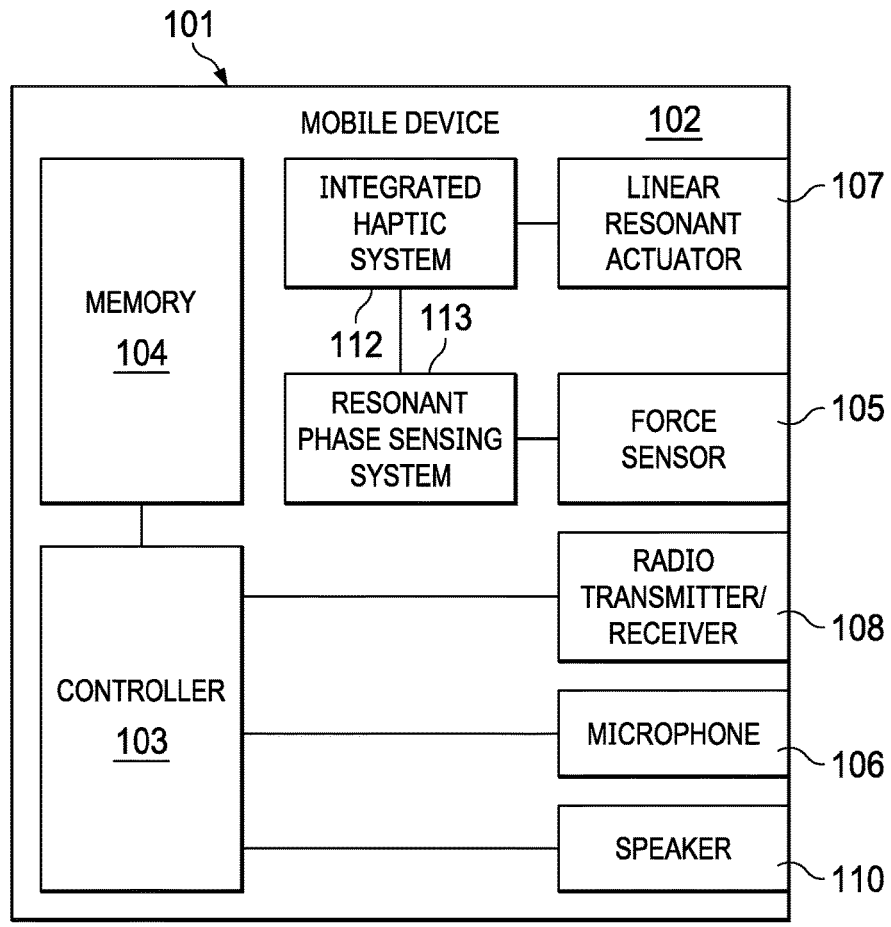
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, a force sensor 105, a microphone 106, a linear resonant actuator 107, a radio transmitter/receiver 108, a speaker 110, an integrated haptic system 112, and a resonant phase sensing system 113.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 interprets and/or executes program instructions and/or processes data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies as based on sonic vibrations received at the diaphragm or membrane. Microphone 106 may include an electrostatic microphone, a condenser microphone, an electret microphone, a microelectromechanical system (MEMS) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The coil and the driver's magnetic system interact, generating a mechanical force that causes the coil (and thus, the attached cone) to move back and forth, thereby reproducing sound under the control of the applied electrical signal coming from the amplifier.

Force sensor 105 may be housed within enclosure 101, and may include any suitable system, device, or apparatus for sensing a force, a pressure, or a touch (e.g., an interaction with a human finger) and generating an electrical or electronic signal in response to such force, pressure, or touch. In some embodiments, such electrical or electronic signal may be a function of a magnitude of the force, pressure, or touch applied to the force sensor. In these and other embodiments, such electronic or electrical signal may comprise a general purpose input/output (GPIO) signal associated with an input signal to which haptic feedback is given. Force sensor 105 may include, without limitation, a capacitive displacement sensor, an inductive force sensor (e.g., a resistive-inductive-capacitive sensor), a strain gauge, a piezoelectric force sensor, force sensing resistor, piezoelectric force sensor, thin film force sensor, or a quantum tunneling composite-based force sensor. For purposes of clarity and exposition in this disclosure, the term "force" as used herein may refer not only to force, but to physical quantities indicative of force or analogous to force, such as, but not limited to, pressure and touch.

Linear resonant actuator 107 may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from integrated haptic system 112, may render haptic feedback to a user of mobile device 102 for at least one of mechanical button replacement and capacitive sensor feedback.

Integrated haptic system 112 may be housed within enclosure 101, may be communicatively coupled to force sensor 105 and linear resonant actuator 107, and may include any system, device, or apparatus configured to receive a signal from force sensor 105 indicative of a force applied to mobile device 102 (e.g., a force applied by a human finger to a virtual button of mobile device 102) and generate an electronic signal for driving linear resonant actuator 107 in response to the force applied to mobile device 102. Detail of an example integrated haptic system in accordance with embodiments of the present disclosure is depicted in FIG. 2.

Resonant phase sensing system 113 may be housed within enclosure 101, may be communicatively coupled to force sensor 105 and linear resonant actuator 107, and may include any system, device, or apparatus configured to detect a displacement of a mechanical member (e.g., mechanical member 305 depicted in FIGS. 3A and 3B, below) indicative of a physical interaction (e.g., by a user of mobile device 102) with the human-machine interface of mobile device 102 (e.g., a force applied by a human finger to a virtual interface of mobile device 102). As described in greater detail below, resonant phase sensing system 113 may detect displacement of such mechanical member by performing resonant phase sensing of a resistive-inductive-capacitive sensor for which an impedance (e.g., inductance, capacitance, and/or resistance) of the resistive-inductive-capacitive sensor changes in response to displacement of the mechanical member. Thus, displacement of the mechanical member may cause a change in an impedance of a resistive-inductive-capacitive sensor integral to resonant phase sense system 113. Resonant phase sensing system 113 may also generate an electronic signal to integrated haptic system 112 to which integrated haptic system 112 may respond by driving linear resonant actuator 107 in response to a physical interaction associated with a human-machine interface associated with the mechanical member. Detail of an example resonant phase sensing system 113 in accordance with embodiments of the present disclosure is depicted in greater detail below.

Although specific example components are depicted above in FIG. 1 as being integral to mobile device 102 (e.g., controller 103, memory 104, force sensor 105, microphone 106, radio transmitter/receiver 108, speakers(s) 110), a mobile device 102 in accordance with this disclosure may comprise one or more components not specifically enumerated above. For example, although FIG. 1 depicts certain user interface components, mobile device 102 may include one or more other user interface components in addition to those depicted in FIG. 1 (including but not limited to a keypad, a touch screen, and a display), thus allowing a user to interact with and/or otherwise manipulate mobile device 102 and its associated components.

Figure 2:
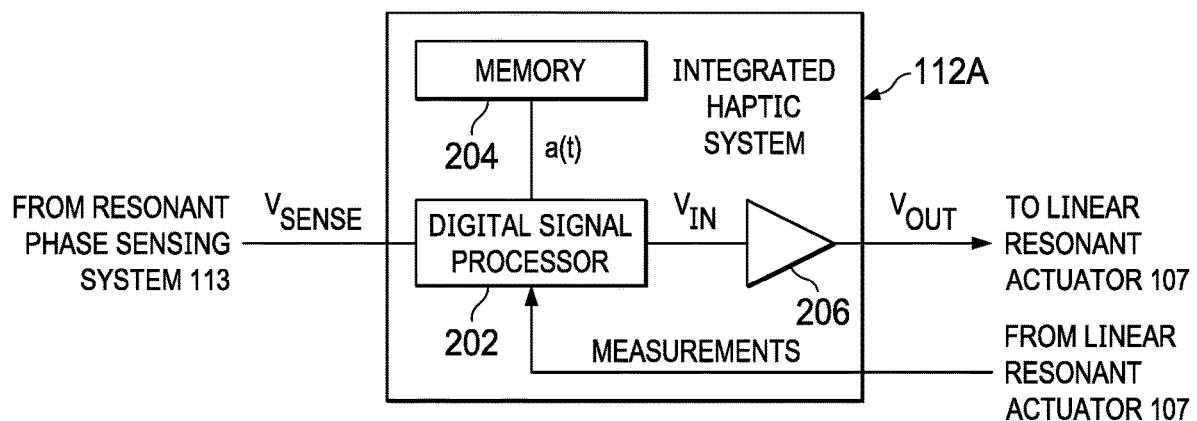
FIG. 2 illustrates a block diagram of selected components of an example integrated haptic system, in accordance with embodiments of the present disclosure.

FIG. 2 illustrates a block diagram of selected components of an example integrated haptic system 112A, in accordance with embodiments of the present disclosure. In some embodiments, integrated haptic system 112A may be used to implement integrated haptic system 112 of FIG. 1. As shown in FIG. 2, integrated haptic system 112A may include a digital signal processor (DSP) 202, a memory 204, and an amplifier 206.

DSP 202 may include any system, device, or apparatus configured to interpret and/or execute program instructions and/or process data. In some embodiments, DSP 202 may interpret and/or execute program instructions and/or process data stored in memory 204 and/or other computer-readable media accessible to DSP 202.

Memory 204 may be communicatively coupled to DSP 202, and may include any system, device, or apparatus configured to retain program instructions and/or data for a period of time (e.g., computer-readable media). Memory 204 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Amplifier 206 may be electrically coupled to DSP 202 and may comprise any suitable electronic system, device, or apparatus configured to increase the power of an input signal $V_{IN}$ (e.g., a time-varying voltage or current) to generate an output signal $V_{OUT}$. For example, amplifier 206 may use electric power from a power supply (not explicitly shown) to increase the amplitude of a signal. Amplifier 206 may include any suitable amplifier class, including without limitation, a Class-D amplifier.

In operation, memory 204 may store one or more haptic playback waveforms. In some embodiments, each of the one or more haptic playback waveforms may define a haptic response a(t) as a desired acceleration of a linear resonant actuator (e.g., linear resonant actuator 107) as a function of time. DSP 202 may be configured to receive a force signal $V_{SENSE}$ from resonant phase sensing system 113 indicative of force applied to force sensor 105. Either in response to receipt of force signal $V_{SENSE}$ indicating a sensed force or independently of such receipt, DSP 202 may retrieve a haptic playback waveform from memory 204 and process such haptic playback waveform to determine a processed haptic playback signal $V_{IN}$. In embodiments in which amplifier 206 is a Class D amplifier, processed haptic playback signal $V_{IN}$ may comprise a pulse-width modulated signal. In response to receipt of force signal $V_{SENSE}$ indicating a sensed force, DSP 202 may cause processed haptic playback signal $V_{IN}$ to be output to amplifier 206, and amplifier 206 may amplify processed haptic playback signal $V_{IN}$ to generate a haptic output signal $V_{OUT}$ for driving linear resonant actuator 107.

In some embodiments, integrated haptic system 112A may be formed on a single integrated circuit, thus enabling lower latency than existing approaches to haptic feedback control. By providing integrated haptic system 112A as part of a single monolithic integrated circuit, latencies between various interfaces and system components of integrated haptic system 112A may be reduced or eliminated.

Figure 3A:
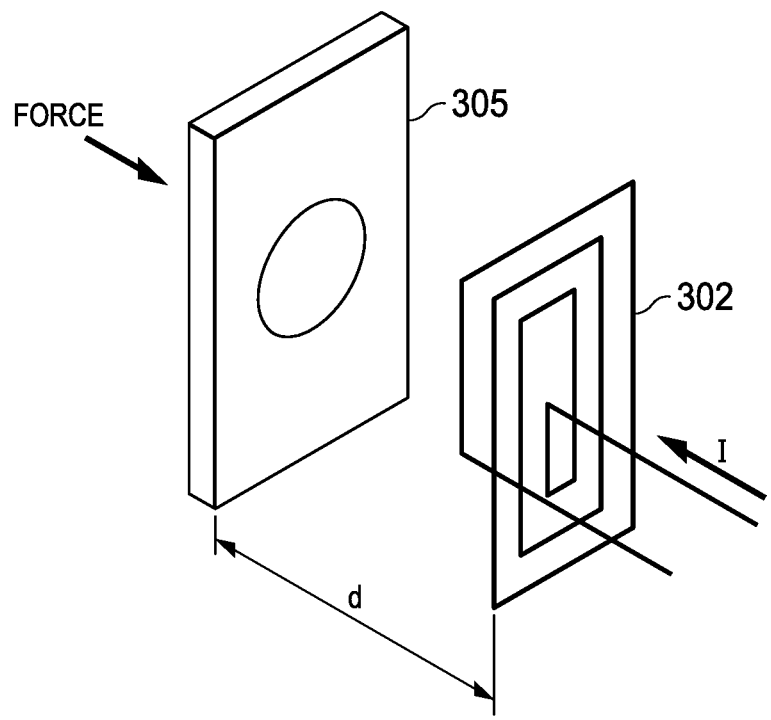
FIG. 3A illustrates a mechanical member separated by a distance from an inductive coil, in accordance with embodiments of the present disclosure.

FIG. 3A illustrates a mechanical member 305 embodied as a metal plate separated by a distance d from an inductive coil 302, in accordance with embodiments of the present disclosure. Mechanical member 305 may comprise any suitable system, device, or apparatus which all or a portion thereof may displace, wherein such displacement affects an electrical property (e.g., inductance, capacitance, etc.) of the mechanical member 305 or another electrical component in electrical communication (e.g., via a mutual inductance) with mechanical member 305.

Figure 3B:
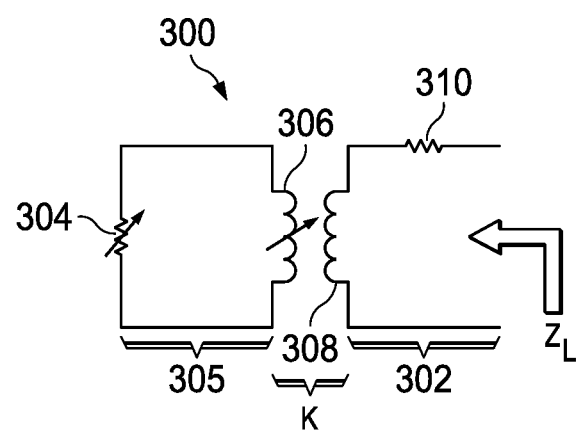
FIG. 3B illustrates selected components of an inductive sensing system that may be implemented by a resonant phase sensing system, in accordance with embodiments of the present disclosure.

FIG. 3B illustrates selected components of an inductive sensing system 300 that may be implemented by force sensor 105 and/or resonant phase sensing system 113, in accordance with embodiments of the present disclosure. As shown in FIG. 3, inductive sensing system 300 may include mechanical member 305, modeled as a variable electrical resistance 304 and a variable electrical inductance 306, and may include inductive coil 302 in physical proximity to mechanical member 305 such that inductive coil 302 has a mutual inductance with mechanical member 305 defined by a variable coupling coefficient k. As shown in FIG. 3, inductive coil 302 may be modeled as a variable electrical inductance 308 and a variable electrical resistance 310.

In operation, as a current I flows through inductive coil 302, such current may induce a magnetic field which in turn may induce an eddy current inside mechanical member 305. When a force is applied to and/or removed from mechanical member 305, which alters distance d between mechanical member 305 and inductive coil 302, the coupling coefficient k, variable electrical resistance 304, and/or variable electrical inductance 306 may also change in response to the change in distance. These changes in the various electrical parameters may, in turn, modify an effective impedance $Z_L$ of inductive coil 302.

Figure 4:
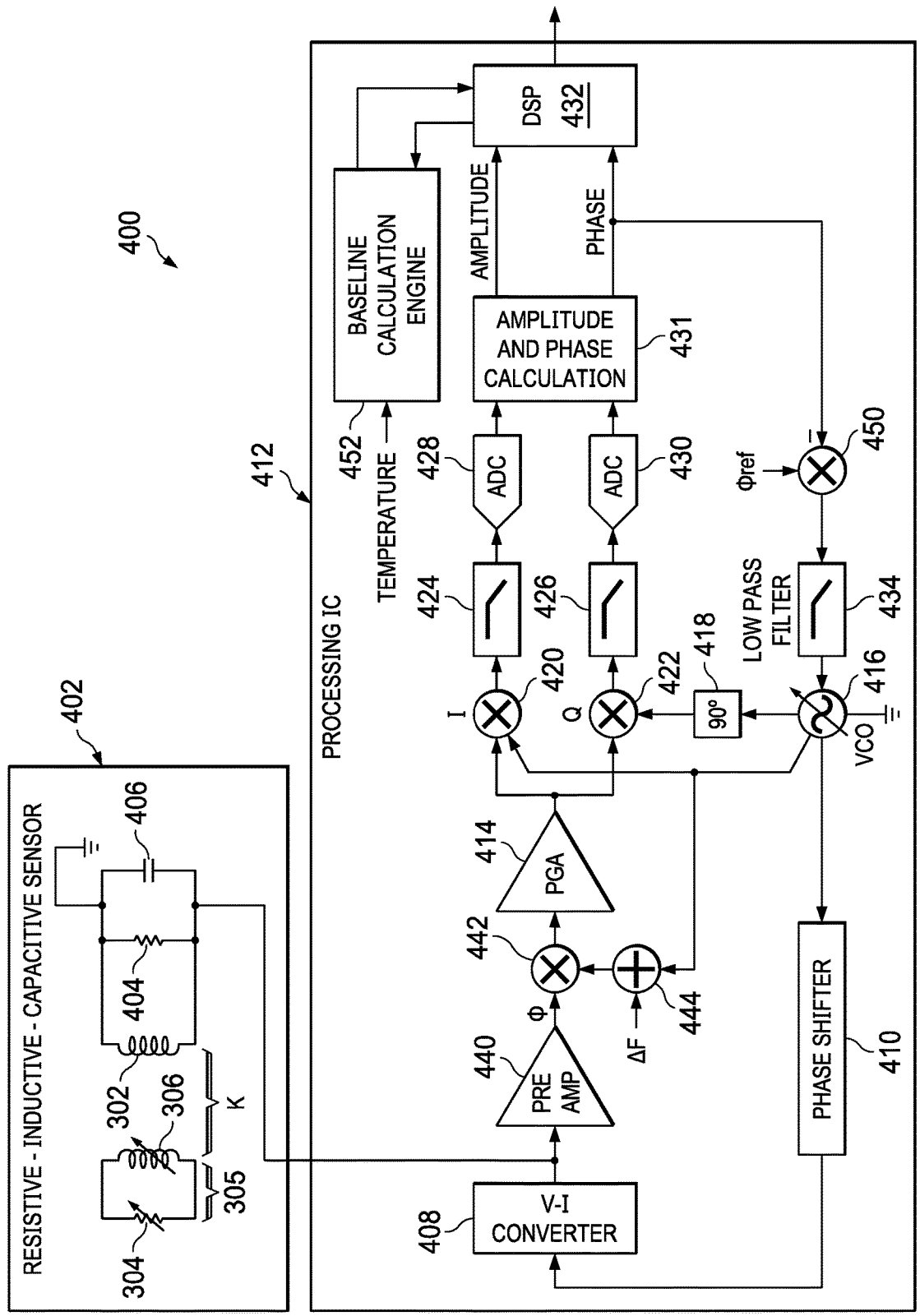
FIG. 4 illustrates a diagram of selected components of an example system for performing resonant phase sensing, in accordance with embodiments of the present disclosure.

FIG. 4 illustrates a diagram of selected components of an example system 400 for performing resonant phase sensing, in accordance with embodiments of the present disclosure. In some embodiments, system 400 may be used to implement resonant phase sensing system 113 of FIG. 1. As shown in FIG. 4, system 400 may include a resistive-inductive-capacitive sensor 402 and a processing integrated circuit (IC) 412. In some embodiments, resistive-inductive-capacitive sensor 402 may implement all or a portion of force sensor 105 and processing integrated circuit (IC) 412 may implement all or a portion of resonant phase sensing system 113.

As shown in FIG. 4, resistive-inductive-capacitive sensor 402 may include mechanical member 305, inductive coil 302, a resistor 404, and capacitor 406, wherein mechanical member 305 and inductive coil 302 have a variable coupling coefficient k. Although shown in FIG. 4 to be arranged in parallel with one another, it is understood that inductive coil 302, resistor 404, and capacitor 406 may be arranged in any other suitable manner that allows resistive-inductive-capacitive sensor 402 to act as a resonant tank. For example, in some embodiments, inductive coil 302, resistor 404, and capacitor 406 may be arranged in series with one another. In some embodiments, resistor 404 may not be implemented with a stand-alone resistor, but may instead be implemented by a parasitic resistance of inductive coil 302, a parasitic resistance of capacitor 406, and/or any other suitable parasitic resistance.

Processing IC 412 may be communicatively coupled to resistive-inductive-capacitive sensor 402 and may comprise any suitable system, device, or apparatus configured to implement a measurement circuit to measure phase information associated with resistive-inductive-capacitive sensor 402 and based on the phase information, determine a displacement of mechanical member 305 relative to resistive-inductive-capacitive sensor 402. Thus, processing IC 412 may be configured to determine an occurrence of a physical interaction (e.g., press or release of a virtual button) associated with a human-machine interface associated with mechanical member 305 based on the phase information.

As shown in FIG. 4, processing IC 412 may include a phase shifter 410, a voltage-to-current converter 408, a preamplifier 440, an intermediate frequency mixer 442, a combiner 444, a programmable gain amplifier (PGA) 414, a voltage-controlled oscillator (VCO) 416, a phase shifter 418, an amplitude and phase calculation block 431, a DSP 432, a low-pass filter 434, a combiner 450, and a baseline calculation engine 452. Processing IC 412 may also include a coherent incident/quadrature detector implemented with an incident channel comprising a mixer 420, a low-pass filter 424, and an analog-to-digital converter (ADC) 428, and a quadrature channel comprising a mixer 422, a low-pass filter 426, and an ADC 430 such that processing IC 412 is configured to measure the phase information using the coherent incident/quadrature detector.

Phase shifter 410 may include any system, device, or apparatus configured to detect an oscillation signal generated by processing IC 412 (as explained in greater detail below) and phase shift such oscillation signal (e.g., by 45 degrees) such that at a normal operating frequency of system 400, an incident component of a sensor signal ϕ generated by preamplifier 440 is approximately equal to a quadrature component of sensor signal ϕ, so as to provide common mode noise rejection by a phase detector implemented by processing IC 412, as described in greater detail below.

Voltage-to-current converter 408 may receive the phase shifted oscillation signal from phase shifter 410, which may be a voltage signal, convert the voltage signal to a corresponding current signal, and drive the current signal on resistive-inductive-capacitive sensor 402 at a driving frequency with the phase-shifted oscillation signal in order to generate sensor signal ϕ which may be processed by processing IC 412, as described in greater detail below. In some embodiments, a driving frequency of the phase-shifted oscillation signal may be selected based on a resonant frequency of resistive-inductive-capacitive sensor 402 (e.g., may be approximately equal to the resonant frequency of resistive-inductive-capacitive sensor 402).

Preamplifier 440 may receive sensor signal ϕ and condition sensor signal ϕ for frequency mixing, with mixer 442, to an intermediate frequency Δf combined by combiner 444 with an oscillation frequency generated by VCO 416, as described in greater detail below, wherein intermediate frequency Δf is significantly less than the oscillation frequency. In some embodiments, preamplifier 440, mixer 442, and combiner 444 may not be present, in which case PGA 414 may receive sensor signal ϕ directly from resistive-inductive-capacitive sensor 402. However, when present, preamplifier 440, mixer 442, and combiner 444 may allow for mixing sensor signal ϕ down to a lower intermediate frequency Δf which may allow for lower-bandwidth and more efficient ADCs and/or which may allow for minimization of phase and/or gain mismatches in the incident and quadrature paths of the phase detector of processing IC 412.

In operation, PGA 414 may further amplify sensor signal $\phi$ to condition sensor signal $\phi$ for processing by the coherent incident/quadrature detector. VCO 416 may generate an oscillation signal to be used as a basis for the signal driven by voltage-to-current converter 408, as well as the oscillation signals used by mixers 420 and 422 to extract incident and quadrature components of amplified sensor signal $\phi$. As shown in FIG. 4, mixer 420 of the incident channel may use an unshifted version of the oscillation signal generated by VCO 416, while mixer 422 of the quadrature channel may use a 90-degree shifted version of the oscillation signal phase shifted by phase shifter 418. As mentioned above, the oscillation frequency of the oscillation signal generated by VCO 416 may be selected based on a resonant frequency of resistive-inductive-capacitive sensor 402 (e.g., may be approximately equal to the resonant frequency of resistive-inductive-capacitive sensor 402).

In the incident channel, mixer 420 may extract the incident component of amplified sensor signal $\phi$, low-pass filter 424 may filter out the oscillation signal mixed with the amplified sensor signal $\phi$ to generate a direct current (DC) incident component, and ADC 428 may convert such DC incident component into an equivalent incident component digital signal for processing by amplitude and phase calculation block 431. Similarly, in the quadrature channel, mixer 422 may extract the quadrature component of amplified sensor signal $\phi$, low-pass filter 426 may filter out the phase-shifted oscillation signal mixed with the amplified sensor signal $\phi$ to generate a direct current (DC) quadrature component, and ADC 430 may convert such DC quadrature component into an equivalent quadrature component digital signal for processing by amplitude and phase calculation block 431. Amplitude and phase calculation block 431 may include any system, device, or apparatus configured to receive phase information comprising the incident component digital signal and the quadrature component digital signal and based thereon, extract amplitude and phase information.

DSP 432 may include any system, device, or apparatus configured to interpret and/or execute program instructions and/or process data. In particular, DSP 432 may receive the phase information and the amplitude information generated by amplitude and phase calculation block 431 and based thereon, determine a displacement of mechanical member 305 relative to resistive-inductive-capacitive sensor 402, which may be indicative of an occurrence of a physical interaction (e.g., press or release of a virtual button or other interaction with a virtual interface) associated with a human-machine interface associated with mechanical member 305 based on the phase information. DSP 432 may also generate an output signal indicative of the displacement. In some embodiments, such output signal may comprise a control signal for controlling mechanical vibration of linear resonant actuator 107 in response to the displacement.

The phase information generated by amplitude and phase calculation block 431 may be subtracted from a reference phase $\phi_{ref}$ by combiner 450 in order to generate an error signal that may be received by low-pass filter 434. Low-pass filter 434 may low-pass filter the error signal, and such filtered error signal may be applied to VCO 416 to modify the frequency of the oscillation signal generated by VCO 416, in order to drive sensor signal $\phi$ towards reference phase $\phi_{ref}$. As a result, sensor signal $\phi$ may comprise a transient decaying signal in response to a "press" of a virtual button (or other interaction with a virtual interface) associated with system 400 as well as another transient decaying signal in response to a subsequent "release" of the virtual button (or other interaction with a virtual interface). Accordingly, low-pass filter 434 in connection with VCO 416 may implement a feedback control loop that may track changes in operating parameters of system 400 by modifying the driving frequency of VCO 416.

Baseline calculation engine 452 may comprise any system, device, or apparatus configured to, as described in greater detail below, calculate an appropriate baseline sensor input for processing a sensor signal $\phi$ as a user interaction with force sensor 105/mechanical member 305 in order to discriminate between user interactions and anomalous force sensor 105/mechanical member 305 sensor signal $\phi$ variations, such as those caused by drift of physical parameters (e.g., aging, temperature, etc.) of force sensor 105, mechanical member 305, resonant phase sensing system 113, etc. Although FIG. 4 depicts that, in some embodiments, baseline calculation engine 452 is external to DSP 432, in some embodiments, functionality of baseline calculation engine 452 may be implemented in whole or part by DSP 432.

Although the foregoing contemplates use of closed-loop feedback for sensing of displacement, the various embodiments represented by FIG. 4 may be modified to implement an open-loop system for sensing of displacement. In such an open-loop system, a processing IC may include no feedback path from amplitude and phase calculation block 431 to VCO 416 or variable phase shifter 418 and thus may also lack a feedback low-pass filter 434. Thus, a phase measurement may still be made by comparing a change in phase to a reference phase value, but the oscillation frequency driven by VCO 416 may not be modified or the phase shifted by variable phase shifter 418 may not be shifted.

Although the foregoing contemplates use of a coherent incident/quadrature detector as a phase detector for determining phase information associated with resistive-inductive-capacitive sensor 402, a resonant phase sensing system 112 may perform phase detection and/or otherwise determine phase information associated with resistive-inductive-capacitive sensor 402 in any suitable manner, including, without limitation, using only one of the incident path or quadrature path to determine phase information.

In some embodiments, an incident/quadrature detector as disclosed herein may include one or more frequency translation stages that translate the sensor signal into direct-current signal directly or into an intermediate frequency signal and then into a direct-current signal. Any of such frequency translation stages may be implemented either digitally after an analog-to-digital converter stage or in analog before an analog-to-digital converter stage.

In addition, although the foregoing contemplates measuring changes in resistance and inductance in resistive-inductive-capacitive sensor 402 caused by displacement of mechanical member 305, other embodiments may operate based on a principle that any change in impedance based on displacement of mechanical member 305 may be used to sense displacement. For example, in some embodiments, displacement of mechanical member 305 may cause a change in a capacitance of resistive-inductive-capacitive sensor 402, such as if mechanical member 305 included a metal plate implementing one of the capacitive plates of capacitor 406.

Although DSP 432 may be capable of processing phase information to make a binary determination of whether physical interaction associated with a human-machine interface associated with mechanical member 305 has occurred and/or ceased to occur, in some embodiments, DSP 432 may quantify a duration of a displacement of mechanical member 305 to more than one detection threshold, for example to detect different types of physical interactions (e.g., a short press of a virtual button versus a long press of the virtual button). In these and other embodiments, DSP 432 may quantify a magnitude of the displacement to more than one detection threshold, for example to detect different types of physical interactions (e.g., a light press of a virtual button versus a quick and hard press of the virtual button).

Although FIG. 4 and the description thereof depicts particular embodiments of a resonant phase sensing system, other architectures for force sensing may be used consistent with this disclosure, including without limitation the various resonant phase sensing system architectures described in U.S. patent application Ser. No. 16/267,079, filed Feb. 4, 2019. Thus, while baseline calculation engine 452 is discussed herein in relation to operation in connection with a resonant phase sensing system, baseline calculation engine 452 may be used with any other suitable force sensing system.

Accordingly, using the systems and methods described above, a resistive-inductor-capacitive sensor is provided wherein part of the inductive component is exposed to the user in the form of a metal plate of a region of a chassis or enclosure (e.g., enclosure 101). As such, displacements in the metal plate or enclosure may correlate to changes in measured phase or amplitude. Intentional displacements due to human interaction may tend to have faster slew rates at system output than displacements or other system changes due to input not from intentional human interaction, such as aging or temperature drift in the metal plate or inductive sensor.

A simple high-pass filter on a signal of interest may be used to cancel undesired inputs not indicative of intentional human interaction. However, such an approach may not be sufficient to sense more complex human interactions for which sensing may be desirable. In addition, such a high-pass filter solution may be less useful when multi-level detection is desired.

Figure 5:
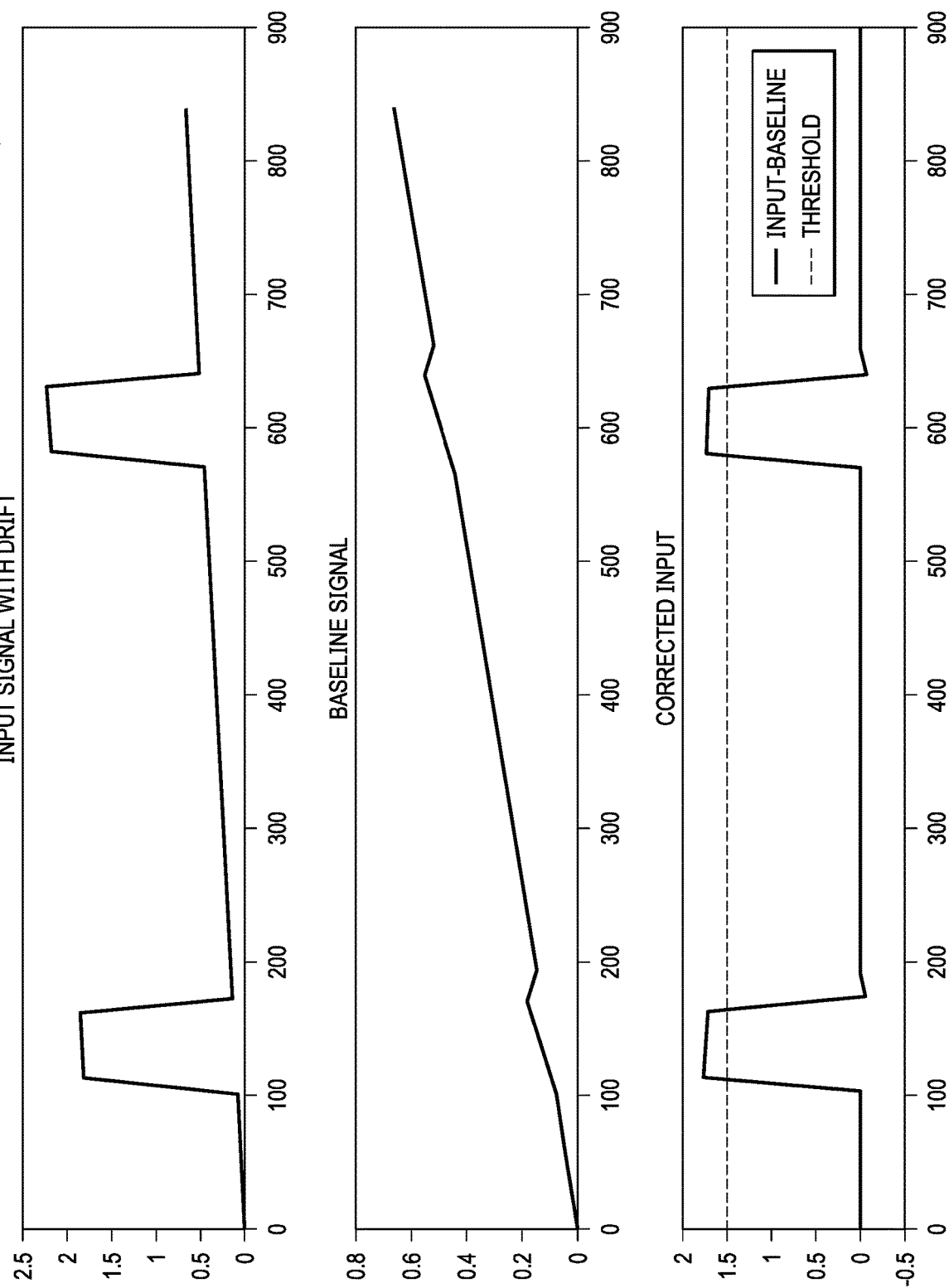
FIG. 5 illustrates example waveforms of example operation of a sensor system wherein a baseline signal is subtracted from a sensor input signal to provide a corrected sensor input signal, in accordance with embodiments of the present disclosure.

Establishing a variable baseline value in a detection system may be useful for isolating an actual signal of interest. If the baseline is designed to track only slow-moving inputs below a range of interest (e.g., essentially a low-pass filtered version of the sensor input signal), subtracting the baseline from the sensor input signal may yield the actual signal of interest (e.g., essentially resulting in a high-pass filtered version of the input). FIG. 5 illustrates example operation of a system (e.g., system 400) using such an approach, wherein a baseline signal representative of sensor input drift is subtracted from a sensor input signal (e.g., sensor signal $\phi$) to provide a corrected sensor input signal.

Figure 6:
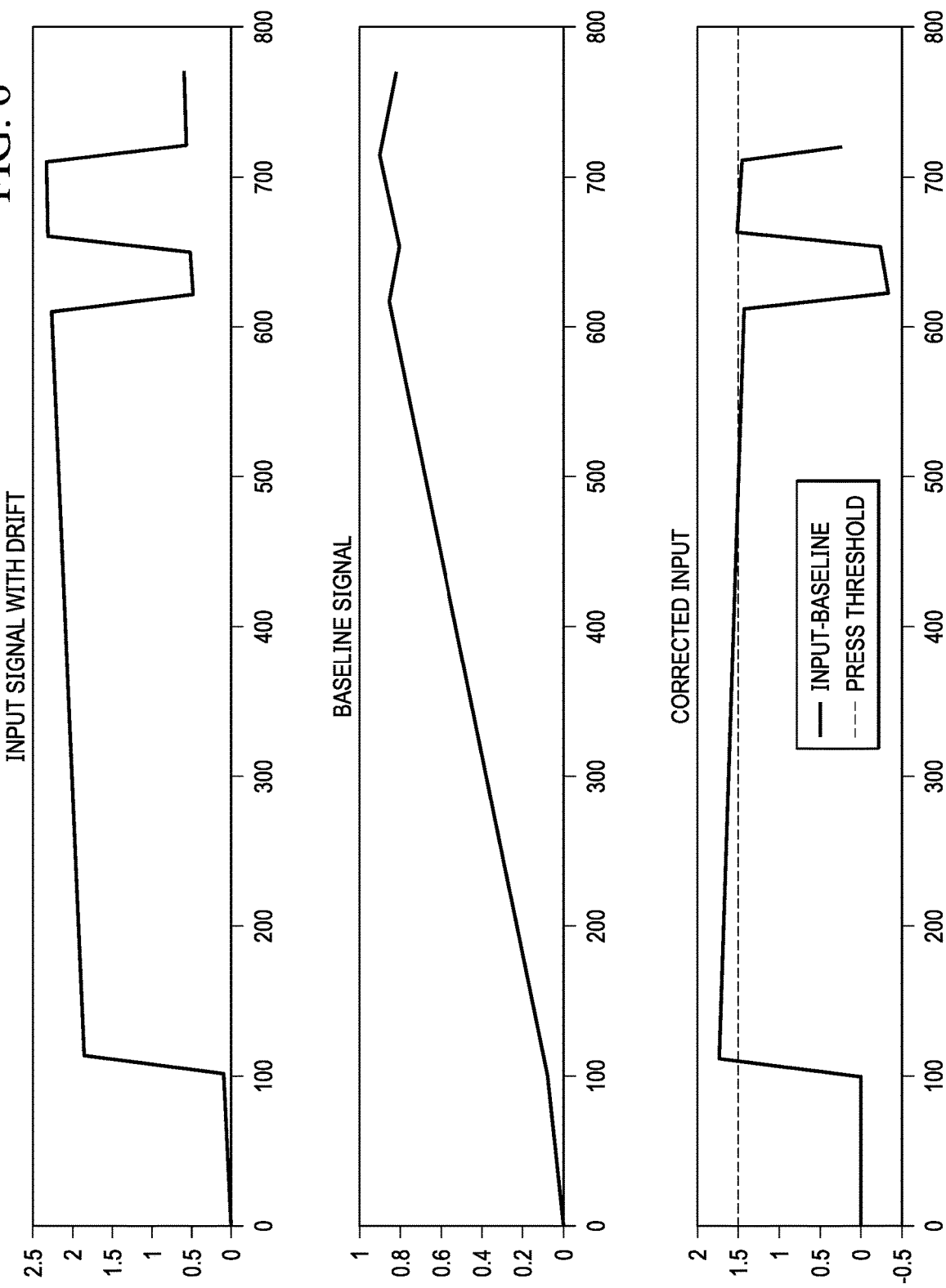
FIG. 6 illustrates example waveforms of example operation of a sensor system wherein a baseline signal is subtracted from a sensor input signal to provide a corrected sensor input signal in the presence of an intentional human interaction having a long duration, in accordance with embodiments of the present disclosure.

However, disadvantages of the approach shown in FIG. 5 may be seen when it is desired to detect intentional human interactions having long durations of time (e.g., long button presses), as shown in FIG. 6. At least two reasons may account for such disadvantages. First, the corrected measurement for the sensor input signal may trend towards zero over a time period defined by a baseline filter bandwidth and measurement delta, meaning an intentional sensor displacement for a time longer than this time period may not be accurately discerned. This is seen in FIG. 6, wherein a corrected sensor input signal drops below an input threshold level (labeled as "press threshold") in the course of a long-duration intentional human interaction. Second, intentional human interactions following a long-duration intentional human interaction may not be detected due to the corrected sensor input signal never exceeding the input threshold level, on account of the significant correction applied by the baseline signal.

Figure 7:
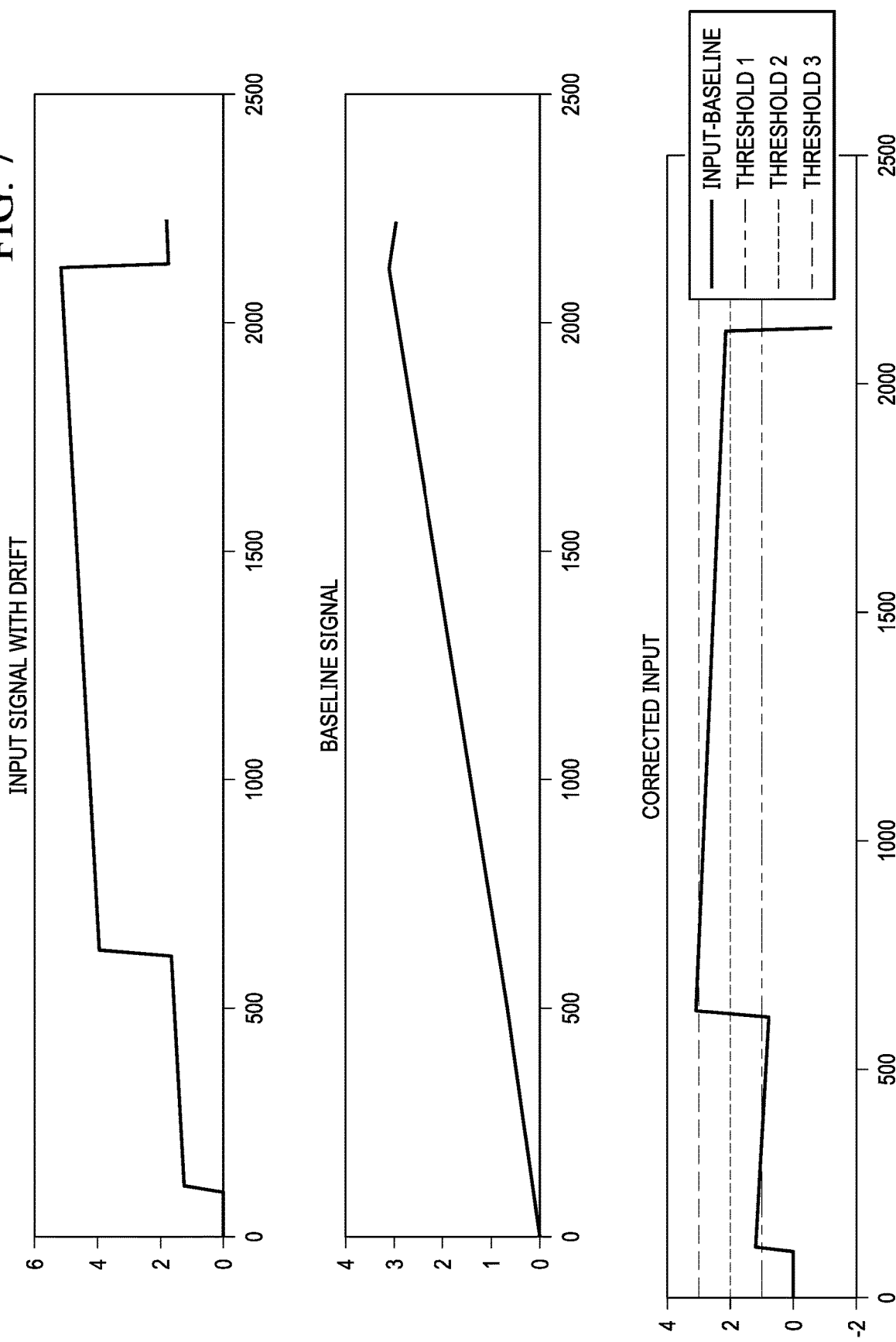
FIG. 7 illustrates example waveforms of example operation of a sensor system wherein a baseline signal is subtracted from a sensor input signal to provide a corrected sensor input signal in the presence of multiple input signal thresholds, in accordance with embodiments of the present disclosure.

Further disadvantages of the approach shown in FIG. 5 may be seen when it is desired to detect intentional human interactions at multiple input threshold levels, as shown in FIG. 7. For example, in the approach shown in FIG. 7, a flag may be asserted each time the corrected input signal exceeds a defined threshold of a plurality of thresholds. However, as a user maintains intentional interaction at a particular level, all the previously asserted flags may begin to successively de-assert as the corrected input signal trends toward zero.

Figure 8:
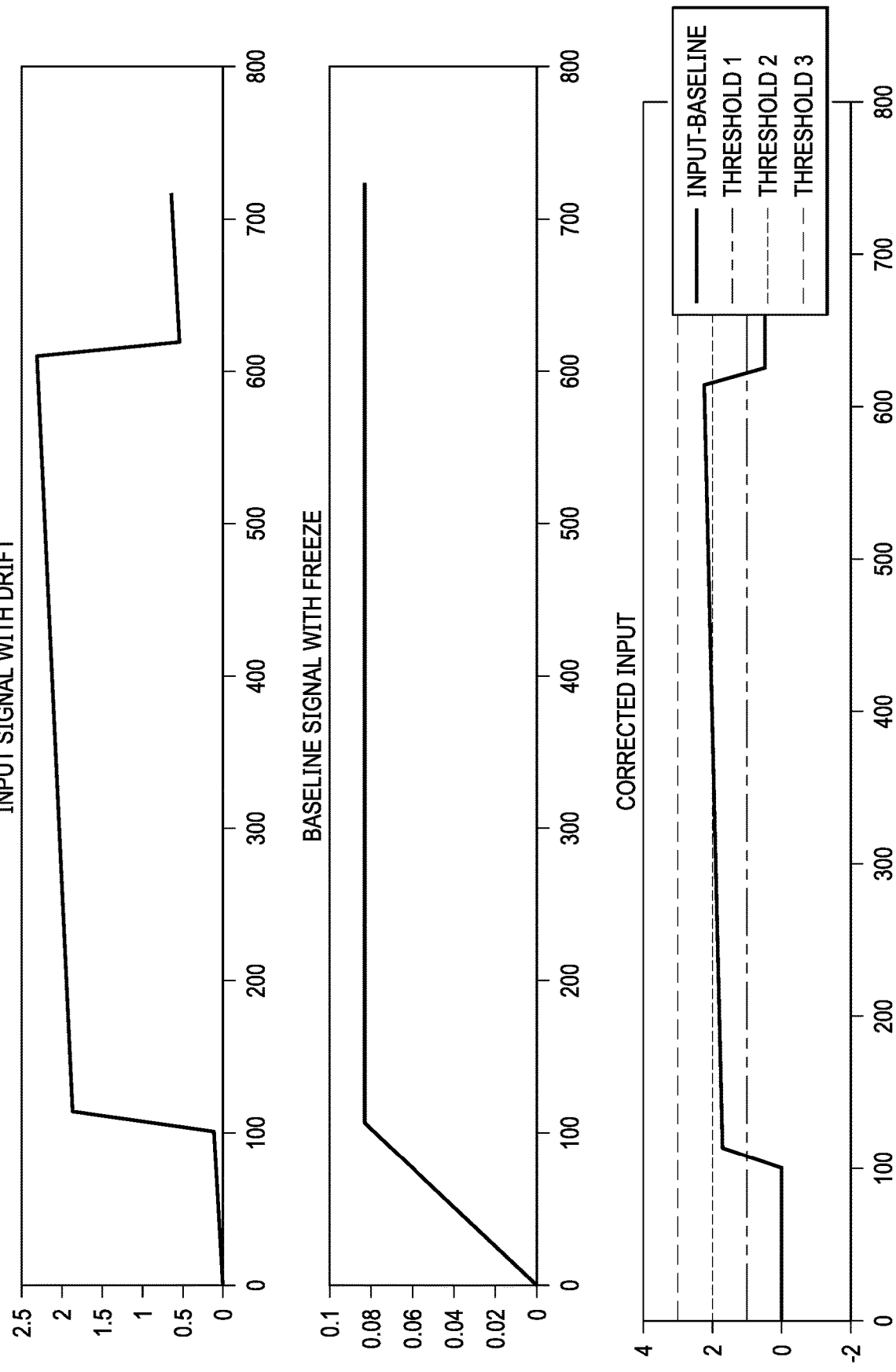
FIG. 8 illustrates example waveforms of example operation of a sensor system wherein a baseline signal is subtracted from a sensor input signal to provide a corrected sensor input signal wherein the baseline signal is frozen during a detected intentional human interaction, in accordance with embodiments of the present disclosure.

FIG. 8 illustrates example operation of a system (e.g., system 400) using another approach, wherein a baseline signal representative of sensor input drift is subtracted from a sensor input signal (e.g., sensor signal $\phi$) to provide a corrected sensor input signal, and the baseline signal is frozen during a detected intentional human interaction.

Figure 9:
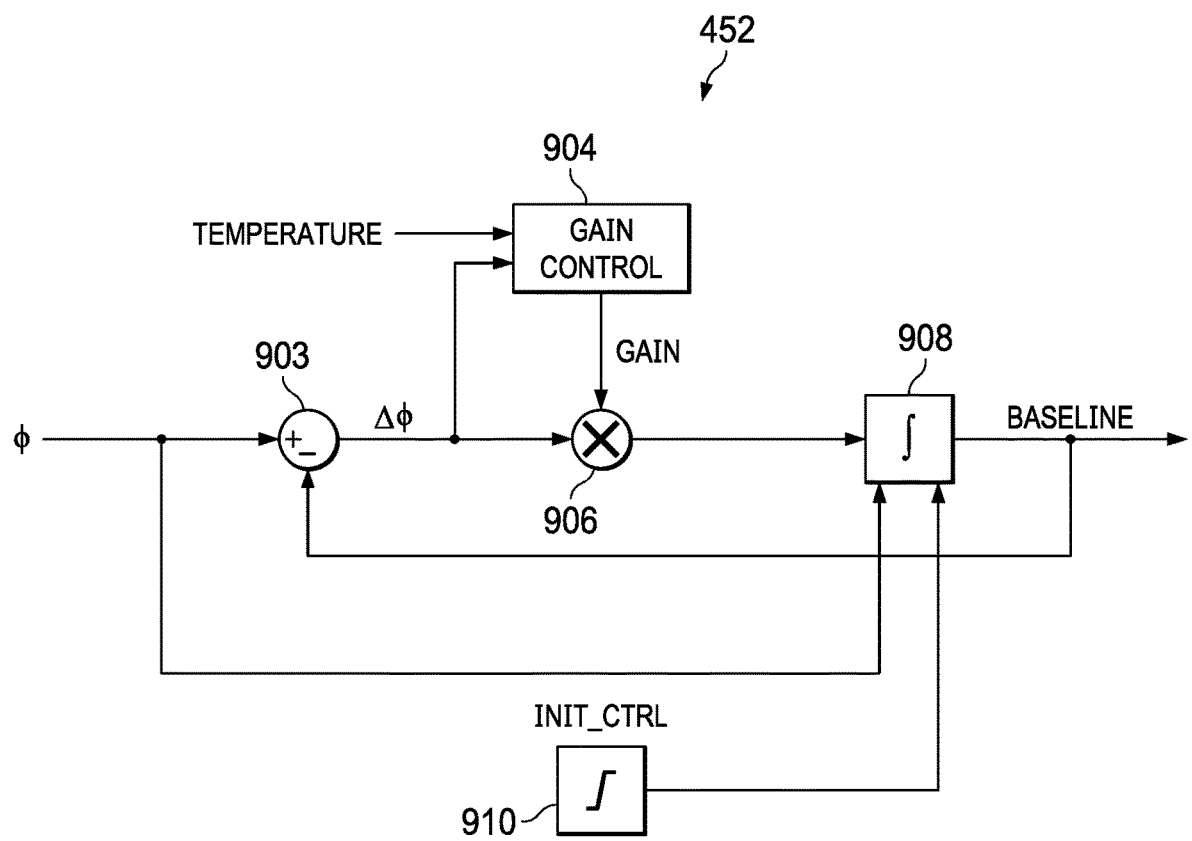
FIG. 9 illustrates a block diagram of selected components of an example baseline calculation engine in which a sensed temperature is used to calculate a baseline signal, in accordance with embodiments of the present disclosure.

As temperature may lead to drift in sensor performance, it may be desirable to user a measurement of temperature in calculating a baseline signal. FIG. 9 illustrates a block diagram of selected components of an example baseline calculation engine 452 in which a sensed temperature is used to calculate a baseline signal, in accordance with embodiments of the present disclosure. As shown in FIG. 9, baseline calculation engine 452 may include a combiner 903, a gain control block 904, and a proportional-integral controller comprising a gain element 906, an integrator 908, and an initialization control block 910. When resonant phase sensing system 113 initially powers on or wakes from a low-powered sleep state, initialization control block 910 may cause integrator 908 to be initialized to a value based on the first-received sensor input signal (e.g., sensor signal $\phi$), and set such first-received sensor input signal as a baseline signal BASELINE.

Under normal operation, combiner 903 may calculate the difference between an instantaneous sensor signal $\phi$ and the output of integrator 908 (e.g., baseline signal BASELINE) as a phase error $\Delta\phi$. Gain control block 904 may determine whether phase error $\Delta\phi$ is greater than a positive threshold value. If phase error $\Delta\phi$ is greater than a positive threshold value, gain control block 904 may reduce a gain factor GAIN of gain element 906 in order to minimize an impact of an active button touch signal. The phase tracking loop implemented by baseline calculation engine 452 may then predict subsequent samples of baseline signal BASELINE based on the dynamics of previous phase data. On the other hand, if phase error $\Delta\phi$ is lower than the positive threshold value, gain control block 904 may set gain factor GAIN to a normal, default value and the phase tracking loop of baseline calculation engine 452 may continue to track input phase data (e.g., sensor signal $\phi$).

Furthermore, gain control block 904 may receive (e.g., from a temperature sensor) a signal indicative of a temperature associated with resonant phase sensing system 113. Based on the sensed temperature, gain control block 904 may calculate a rate of change of the sensed temperature and control gain factor GAIN as a function of such temperature rate of change (e.g., increasing gain factor GAIN with increasing temperature rates of change, decreasing gain factor GAIN with decreasing temperature rates of change).

Accordingly, baseline calculation engine 452 as depicted in FIG. 9 may adjust baseline signal BASELINE based on temperature and/or signal phase, and/or may adaptively adjust a tracking rate for such baseline adjustment based on temperature and/or signal phase.

In some embodiments, baseline calculation engine 452 may be configured to modify baseline signal BASELINE periodically at an update frequency. In such embodiments, baseline calculation engine 452 may be configured to set the update frequency based on a magnitude of temperature and/or a rate of change of temperature. Accordingly, for certain ranges of temperature and/or for large changes in temperature, baseline calculation engine 452 may update baseline signal BASELINE more frequently as compared to other ranges of temperature and/or for smaller changes in temperature.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A control method for a user interface system comprising:
   receiving an input signal;
   receiving a temperature signal indicative of a temperature;
   generating a baseline signal based on at least one among the input signal and the temperature signal;
   calculating an error signal based on a difference of the input signal and the baseline signal; and
   modifying the baseline signal based on the error signal.

2. The method of claim 1, further comprising monitoring for changes of the phase in the input signal.

3. The method of claim 1, wherein the error signal is calculated based on a difference between an instantaneous phase of the input signal and an output of a phase integrator.

4. The method of claim 1, further comprising:
   comparing the error signal to a threshold; and
   reducing a gain factor applied to the error signal in order to calculate the baseline signal if the error signal is greater than the threshold.

5. The method of claim 4, further comprising controlling the gain factor based on the temperature.

6. The method of claim 3, wherein controlling the gain factor based on the temperature comprises controlling the gain factor based on a time rate of change of the temperature.

7. The method of claim 1, wherein the input signal is generated by a force sensor.

8. The method of claim 7, wherein the force sensor is configured to sense a force associated with a human interaction with a virtual button.

9. The method of claim 7, wherein the force sensor comprises one of a capacitive displacement sensor, an inductive force sensor, a resistive-inductive-capacitive sensor, a strain gauge, a piezoelectric force sensor, a force sensing resistor, a thin film force sensor, or a quantum tunneling composite-based force sensor.

10. The method of claim 1, wherein the input signal is indicative of a phase.

11. The method of claim 1, further comprising generating a corrected input signal based on the baseline signal and the input signal.

12. The method of claim 1, further wherein:
    modifying the baseline signal comprising modifying the baseline signal in accordance with an update frequency; and
    setting the update frequency based on the temperature.

13. The method of claim 4, further wherein:
    modifying the baseline signal comprising modifying the baseline signal in accordance with an update frequency; and
    setting the update frequency based on a time rate of change of the temperature.

14. A system comprising:
    a first input for receiving an input signal;
    a second input for receiving a temperature signal indicative of a temperature;
    an output for generating a baseline signal based on the input signal; and
    a baseline calculation engine configured to:
        generate the baseline signal based on at least one among the input signal and the temperature signal;

calculate an error signal based on a difference of the input signal and the baseline signal; and modify the baseline signal based on the error signal.

15. The system of claim 14, the baseline calculation engine further configured to monitor for changes of the phase in the input signal.

16. The system of claim 14, wherein the error signal is calculated based on a difference between an instantaneous phase of the input signal and an output of a phase integrator.

17. The system of claim 14, the baseline calculation engine further configured to:

compare the error signal to a threshold; and reduce a gain factor applied to the error signal in order to calculate the baseline signal if the error signal is greater than the threshold.

18. The system of claim 17, the baseline calculation engine further configured to control the gain factor based on the temperature.

19. The system of claim 6, wherein controlling the gain factor based on the temperature comprises controlling the gain factor based on a time rate of change of the temperature.

20. The system of claim 14, wherein the input signal is generated by a force sensor.

21. The system of claim 20, wherein the force sensor is configured to sense a force associated with a human interaction with a virtual button.

22. The system of claim 20, wherein the force sensor comprises one of a capacitive displacement sensor, an inductive force sensor, a resistive-inductive-capacitive sensor, a strain gauge, a piezoelectric force sensor, a force sensing resistor, a thin film force sensor, or a quantum tunneling composite-based force sensor.

23. The system of claim 14, wherein the input signal is indicative of a phase.

24. The system of claim 14, the baseline calculation engine further configured to generate a corrected input signal based on the baseline signal and the input signal.

25. The system of claim 14, the baseline calculation engine further configured to:

modify the baseline signal comprising modifying the baseline signal in accordance with an update frequency; and set the update frequency based on the temperature.

26. The system of claim 14, the baseline calculation engine further configured to:

modify the baseline signal by modifying the baseline signal in accordance with an update frequency; and set the update frequency based on a time rate of change of the temperature.

* * * * *

UNITED STATES PATENT AND TRADEMARK OFFICE
CERTIFICATE OF CORRECTION

| | |
|---|---|
| PATENT NO. | : 11,579,030 B2 |
| APPLICATION NO. | : 17/080455 |
| DATED | : February 14, 2023 |
| INVENTOR(S) | : Li et al. |

It is certified that error appears in the above-identified patent and that said Letters Patent is hereby corrected as shown below:

In the Claims

1. In Column 14, Line 29, in Claim 6, delete "claim 3," and insert -- claim 5, --, therefor.

2. In Column 14, Line 53, in Claim 13, delete "claim 4," and insert -- claim 1, --, therefor.

3. In Column 15, Line 18, in Claim 19, delete "claim 6," and insert -- claim 18, --, therefor.

Signed and Sealed this
Twentieth Day of June, 2023

Katherine Kelly Vidal
*Director of the United States Patent and Trademark Office*